US008880846B2

(12) United States Patent
Nakajima et al.

(10) Patent No.: US 8,880,846 B2
(45) Date of Patent: Nov. 4, 2014

(54) SEMICONDUCTOR DEVICE (71) Applicant: Renesas Electronics Corporation, Kawasaki (JP)

(72) Inventors: Hiroyuki Nakajima, Kawasaki (JP); Shigeyuki Ueno, Kawasaki (JP)

(73) Assignee: Renesas Electronics Corporation, Kanagawa (JP)

( * ) Notice: Subject to any disclaimer, the term of this patent is extended or adjusted under 35 U.S.C. 154(b) by 156 days.

(21) Appl. No.: 13/739,562

(22) Filed: Jan. 11, 2013

(65) Prior Publication Data
US 2013/0198486 A1    Aug. 1, 2013

(30) Foreign Application Priority Data

Feb. 1, 2012    (JP) ................................ 2012-020046

(51) Int. Cl.
| G06F 12/10 | (2006.01) |
| H04L 1/00 | (2006.01) |
| H03M 13/29 | (2006.01) |
| H03M 13/00 | (2006.01) |
| G06F 12/02 | (2006.01) |
| H03M 13/41 | (2006.01) |
| G06F 9/34 | (2006.01) |

(52) U.S. Cl.
CPC .............. *G06F 12/10* (2013.01); *H04L 1/0071* (2013.01); *H03M 13/2936* (2013.01); *H03M 13/618* (2013.01); *G06F 12/02* (2013.01); *H03M 13/41* (2013.01); *H04L 1/0052* (2013.01); *G06F 9/34* (2013.01); *H03M 13/6362* (2013.01)
USPC .......................................... 711/206; 712/226

(58) Field of Classification Search
USPC ........................... 711/206; 712/226, E09.035
See application file for complete search history.

(56) References Cited

FOREIGN PATENT DOCUMENTS

| JP | 59-114655 A | 7/1984 |
| JP | 3-260750 A | 11/1991 |

*Primary Examiner* — Yong Choe
(74) *Attorney, Agent, or Firm* — Sughrue Mion, PLLC (57) ABSTRACT

A semiconductor device according to the present invention includes a first address generation unit that includes a first register group and generates a table address by a cyclically repeating first pattern using a value stored to the first register group, a second address generation unit that includes a second register group and generates an access address by a cyclically repeating second pattern using a value stored to the second register group and parameter information determined by the table address, and a control unit that outputs setting information to be supplied to the first register group and the second register group. Further, the semiconductor device performs at least one of a read process and a write process of data from and to a data memory using the access address.

19 Claims, 9 Drawing Sheets

```
for (i=0; i<max1; i++) {
    RA = ptr1 + PA1[TA1];
    ptr1 = (ptr1 + step1) % len1;
    if (j==tmax1) {
        j = 0;
    }
    else{
        TA1 = tptr1
        tptr1 = (tptr1 + tstep1) % tlen1
        j++;
    }
}
```

SEMICONDUCTOR DEVICE

CROSS-REFERENCE TO RELATED APPLICATIONS

This application is based upon and claims the benefit of priority from Japanese patent application No. 2012-020046, filed on Feb. 1, 2012, the disclosure of which is incorporated herein in its entirety by reference.

BACKGROUND

The present invention relates to a semiconductor device, and particularly to a semiconductor device that continuously accesses irregular addresses in a memory.

Countries adopt different broadcast systems in wireless communications such as television broadcasting. However, in order to develop a receiver (television and recorder, for example) that supports multiple wireless systems, there is a problem of increasing development and manufacturing cost when development of such a receiver is advanced for each broadcast system. Accordingly, there is an increasing demand for semiconductor devices that perform wireless processes in the receiver performing such wireless communications to include a multi-standard feature supporting multiple broadcast systems. Further, such a receiver is requested to include a multi-channel feature that receives multiple broadcast channels simultaneously and allows viewing or recording of multiple programs simultaneously. Therefore, there also is an increasing demand for the semiconductor device to include the multi-channel feature that processes multiple programs at the same time.

However, in order to realize all the functions supporting the multi-standard and multi-channel features by hardware, there is a problem in the circuit size that increases along with the number of broadcast systems and the number of channels to be processed simultaneously so as to process individual broadcast systems and multiple channels. This lead to the suggestion of software-defined radio that realizes the multi-standard and multi-channel features by software operating on a DSP (Digital Signal Processor).

The software-defined radio performs a demodulation process of wireless signals. In this demodulation process, it is necessary to perform a decoding process represented by a deinterleave process that rearranges complicated data across a wide range on a time axis. More specifically, the deinterleave process needs to perform irregular memory accesses according to continuous stream processes. Note that the deinterleave process is a reverse process of an interleaving process performed by a transmitter side, and the format of data arrangement in the deinterleave process is determined depending on the interleaving processes by the transmitter side.

However, it is difficult for a common DSP to perform such irregular and continuous memory accesses due to limited processing capacity. Thus, Japanese Unexamined Patent Application Publication Nos. 59-114655 and 03-260750 disclose a technique for efficiently performing irregular and continuous memory accesses.

Japanese Unexamined Patent Application Publication No. 59-114655 discloses a data transfer device that transfers data from a first memory region to a second memory region. This data transfer device includes a central processing unit, the first storage device, the second storage device, storage means, address generate and supply means, and address read and supply means.

Data to be transferred is stored to the first storage device. The second storage apparatus stores the data to be transferred. The storage means stores a correspondence table between an address in the first storage device and an address in the second storage device for each data to be transferred. Upon receipt of a read start address of data in the first storage device from the central processing unit, the address generate and supply means supplies the first storage device with a read address for each data to be transferred. Upon receipt of the read start address of the data in the first storage device, the address read and supply means reads from the storage means an address in the second storage device that corresponds to the read address in the first storage device, and supplies the second storage device with the address as a write address.

That is, the data transfer device disclosed in Japanese Unexamined Patent Application Publication No. 59-114655 converts the read address in the first storage device into the write address in the second storage device using the correspondence table. In this way, the data transfer device disclosed in Japanese Unexamined Patent Application Publication No. 59-114655 is capable of efficiently writing data to the address in the second storage device that is different from the read address in the first storage device.

Japanese Unexamined Patent Application Publication No. 03-260750 discloses a DMA (Direct Memory Access) transfer method that performs data transfer among multiple storage devices using a central processing unit and a DMA controller. The technique disclosed in Japanese Unexamined Patent Application Publication No. 03-260750 includes a conversion table that converts continuous addresses of a transfer destination supplied from the DMA controller into non-continuous addresses for accessing multiple storage devices, a conversion table that converts the addresses of a transfer source into non-continuous addresses, and an address conversion unit that converts the addresses output from the DMA controller using both conversion tables into real addresses.

That is, in the technique disclosed in Japanese Unexamined Patent Application Publication No. 03-260750, the conversion table and the address conversion unit convert the addresses output from the DMA controller into addresses that are different between the transfer source addresses and the transfer destination addresses. In this way, Japanese Unexamined Patent Application Publication No. 03-260750 disclose a technique that realizes efficient data transfer to the transfer destination with the address different from the transfer source address.

SUMMARY

Japanese Unexamined Patent Application Publication Nos. 59-114655 and 03-260750 convert the read address into the write address using the conversion tables. Accordingly, in order to support multiple communication systems, it is necessary to prepare conversion tables for all the communication systems to be supported, thereby increasing the size of the conversion tables. Moreover, Japanese Unexamined Patent Application Publication Nos. 59-114655 and 03-260750 need to prepare all address conversion patterns in the conversion tables and requires a large conversion table only for one conversion pattern. The increase in the conversion table leads to a problem of increasing a memory that stores this conversion table and thereby increasing the circuit size.

A first aspect of the present invention is a semiconductor device including a first address generation unit that includes a first register group and generates a table address by a cyclically repeating first pattern using a value stored to the first register group, a second address generation unit that includes a second register group and generates an access address by a cyclically repeating second pattern using a value stored to the second register group and parameter information determined by the table address, and a control unit that outputs setting information to be supplied to the first register group and the second register group, in which the semiconductor device performs at least one of a read process and a write process of data from and to a data memory using the access address.

Another aspect of the present invention is a semiconductor device including an operational unit that performs a calculation in accordance with a program, a memory controller that starts an operation in response to an instruction output from the operational unit, and a data memory that inputs and output data based on an access address output from the memory controller. The memory controller includes a control unit that determines an access rule to the data memory in response to the instruction and outputs setting information corresponding to the determined access rule, a first address generation unit that generates a table address by a cyclically repeating first pattern using the setting information, and a second address generation unit that generates a temporary address by a cyclically repeating second pattern using the setting information and generates the access address based on the parameter information determined by the temporary address and the table address.

The semiconductor device according to the present invention generates the parameter information used for generating the access address from table information based on the table address that is generated by the first address generation unit. Further, in the semiconductor device according to the present invention, the second address generation unit generates the access address using the parameter information. At this time, the first address generation unit and the second address generation unit each generate an address by a cyclically repeating pattern. Accordingly, the semiconductor device according to the present invention can generate a non-continuous access address that repeats in a far longer cycle as compared to the size of the table information.

The semiconductor device according to the present invention can generate the non-continuous access address repeating in the long cycle from small pieces of the table information.

BRIEF DESCRIPTION OF THE DRAWINGS

The above and other aspects, advantages and features will be more apparent from the following description of certain embodiments taken in conjunction with the accompanying drawings, in which.

DETAILED DESCRIPTION

First Embodiment

Figure 1:
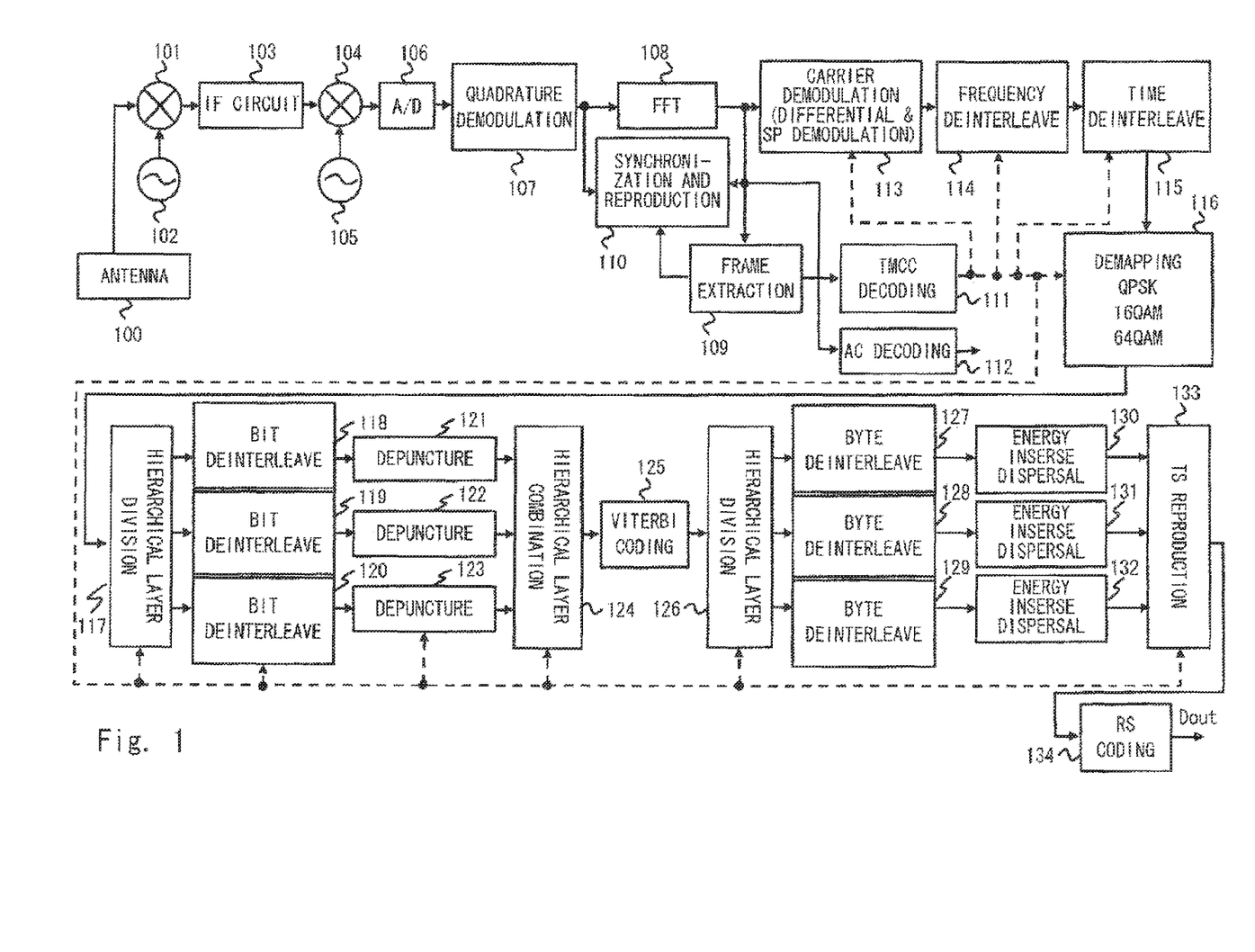
FIG. 1 is a block diagram showing a flow of a reception process of a reception device incorporating a deinterleave process according to the present invention.

Hereinafter, embodiments of the present invention are explained with reference to the drawings. First, a semiconductor device according to the present invention generates reception data by decoding a reception signal using an operational unit such as a DSP (Digital Signal Processor). FIG. 1 is a block diagram showing a flow of the decoding process in a receiver incorporating the decoding process by the semiconductor device according to the present invention. The block diagram shown in FIG. 1 illustrates processes defined by ARID standard and an example of the decoding process.

As shown in FIG. 1, firstly the receiver receives an RF (Radio Frequency) signal by an antenna 100. The RF signal is supplied to a mixer 101. The mixer 101 modulates the RF signal by a local signal generated by an oscillator 102. The signal output from the mixer 101 is supplied to an IF circuit 103. The IF circuit 103 extracts an IF signal from the signal modulated by the mixer 101. Next, the IF signal is further modulated by a local signal generated by the oscillator 105 in the mixer 104 and be a baseband signal. After that, the baseband signal is converted into digital data in an analog-to-digital conversion process 106. The processes up to the analog-to-digital conversion process 106 are processes for an analog signal and are performed by individual semiconductor devices. On the other hand, the processes on and after the analog-to-digital conversion process 106 are processes for a digital signal and can be processed by software using a DSP, for example.

A quadrature demodulation process 107 is performed to the digital data generated in the analog-to-digital conversion process 106 and data of a selected channel is extracted. After that, an FFT (Fast Fourier Transform) process 108 is performed to the digital data that has been subjected to the channel selection. In the FFT process 108, the FFT process is performed for periods corresponding to effective symbols among OFDM (Orthogonal Frequency Division Multiplexing) symbols. At this time, the FFT process is performed for an appropriate period in consideration of multipath propagation of the reception signal.

After that, a frame extraction process 109 is performed to the digital data that has been subjected to the FFT process. In the frame extraction process 109, a frame synchronization signal is extracted from a TMCC (Transmission and Multiplexing Configuration Control) signal included in the digital data that has been subjected to the FFT Process. The frame synchronization signal includes information regarding a mode and a guard interval length. The mode and the guard interval length are information added by a transmitter side and used to reduce the influence of the multipath propagation. Then, in a synchronization and reproduction process 110, OFDM symbol synchronization is performed according to the mode and the guard interval length, and an FFT sample frequency is reproduced.

Next, in the frame extraction process 109, the TMCC signal is passed to a TMCC decoding process 111. In the TMCC decoding process 111, TMCC information is extracted from the TMCC signal and various control is carried out.

In an AC decoding process 112, when configuration identification of an AC signal at a segment No. 0 output from the FFT process 108 indicates a transmission of earthquake motion alarm information (i.e., "001" and "110"), the earthquake motion alarm information is extracted. When the configuration identification indicates anything other than the earthquake motion alarm information, the AC signal will not be decoded. Note that the earthquake motion alarm information is based on the definition in ARIB STD-B31 "Transmission System for Digital Terrestrial Television Broadcasting".

Moreover, a carrier demodulation process 113 is performed to the digital data generated by the FFT process 108. In the carrier demodulation process 113, according to the TMCC information, differential demodulation for DQPSK (Differential Quadrature Phase Shift Keying) and synchronous demodulation using Scattered Pilot (SP) is performed for QPSK (Quadrature Phase Shift Keying), 16 QAM (16 Quadrature Amplitude Modulation), and 64 QAM (64 Quadrature Amplitude Modulation), and an amplitude and phase information is detected.

Next, a frequency deinterleave process 114 and a time deinterleave process 115 are performed. In the frequency deinterleave process 114, the data generated by the FFT process 108 is rearranged on a frequency axis. In the time deinterleave process 115, the data that has been subjected to the frequency deinterleave process is further rearranged on a time axis. An arrangement algorithm in this deinterleave process is a reverse algorithm of the rearrangement algorithm in a frequency interleave process and a time interleave process performed on the transmitter side.

Next, a demapping process 116 is performed. In the demapping process 116, demapping for QPSK, 16 QAM, and 64 QAM is performed from the carrier-demodulated information, and bit information is extracted.

Subsequently, a hierarchical layer division process 117 is performed. In the hierarchical layer division process 117, when it is revealed that wireless signals are received in a hierarchical layer transmission for simultaneously transmitting multiple hierarchical layers with different transmission characteristics based on the TMCC information, the data that has been subjected to the demapping process is divided into each hierarchical layer. Note that in the division, one unit is 204 bytes starting from the byte next to the TS packet synchronization byte (47 H) to the next TS synchronization byte.

Next, bit deinterleave processes 118 to 120 are performed. In the bit deinterleave processes 118 to 120, the bit deinterleave process is performed for each of the divided hierarchical layers.

Next, depuncturing processes 121 to 123 are performed. In the depuncturing processes 121 to 123, bit interpolation is performed to convolutional codes for each divided hierarchical layer according to a convolutional code rate specified by the TMCC information.

Next, a hierarchical layer combination process 124 is performed. In the hierarchical layer combination process 124, the data that has been divided into hierarchical layers is combined to generate one piece of data. Next, in a Viterbi decoding process 125, a Viterbi decoding process is performed to the data that has been subjected to the hierarchical layer combination. With the method shown in FIG. 1, in the Viterbi decoding process 125, Viterbi decoding with a coding rate ½ is performed to the depunctured data. In the Viterbi decoding, a soft decision process is performed in order to improve the performance. Moreover, termination is performed using that the TS packet synchronization byte (47 H) is already known so as to avoid error propagation by the convolutional codes.

Next, a hierarchical layer division process 126 is performed again. This hierarchical layer division process 126 is the same process as the hierarchical layer division process 117. After that, byte deinterleave processes 127 to 129 are performed. In the byte deinterleave processes 127 to 129, a deinterleave process is performed for each of the divided hierarchical layers. Moreover, in the byte deinterleave process, the deinterleave process is performed per byte.

Then, energy inverse dispersal processes 130 to 132 are performed. The energy inverse dispersal processes 130 to 132 perform an energy inverse dispersal process for each of the divided hierarchical layer. In the energy inverse dispersal processes 130 to 132, exclusive OR is applied to perform inverse dispersal for each bit excluding 15th-order M series PN signal and the TS packet synchronization byte. Note that a shift register operates even during the synchronization byte period and is initialized for each OFDM transmission frame.

Next, a TS reproduction process 133 is performed. In the TS reproduction process 133, a process for transport stream reproduction is performed. At this time, order of TS packets and a temporal position of PCR must be maintained to be the same as the transmitter side. After that, an RS decoding process 134 is performed to generate reproducible TS stream data. In the RS decoding process 134, a shortened Reed-Solomon code RS is decoded. When an error is detected after the correction, transport_error_indicator at a ninth bit (second byte MSB) from the beginning of the transport stream is set to "1".

As described above, in the communication system using the receiver, the interleave process is performed at the time of generating a transmission signal and the deinterleave process is performed at the time of receiving the signal, thereby preventing errors generated upon transmission from being concentrated on one of the decoded data. The interleave process and the deinterleave process distribute errors into multiple pieces of data, and this improves error correction capability in the communication system.

Figure 2:
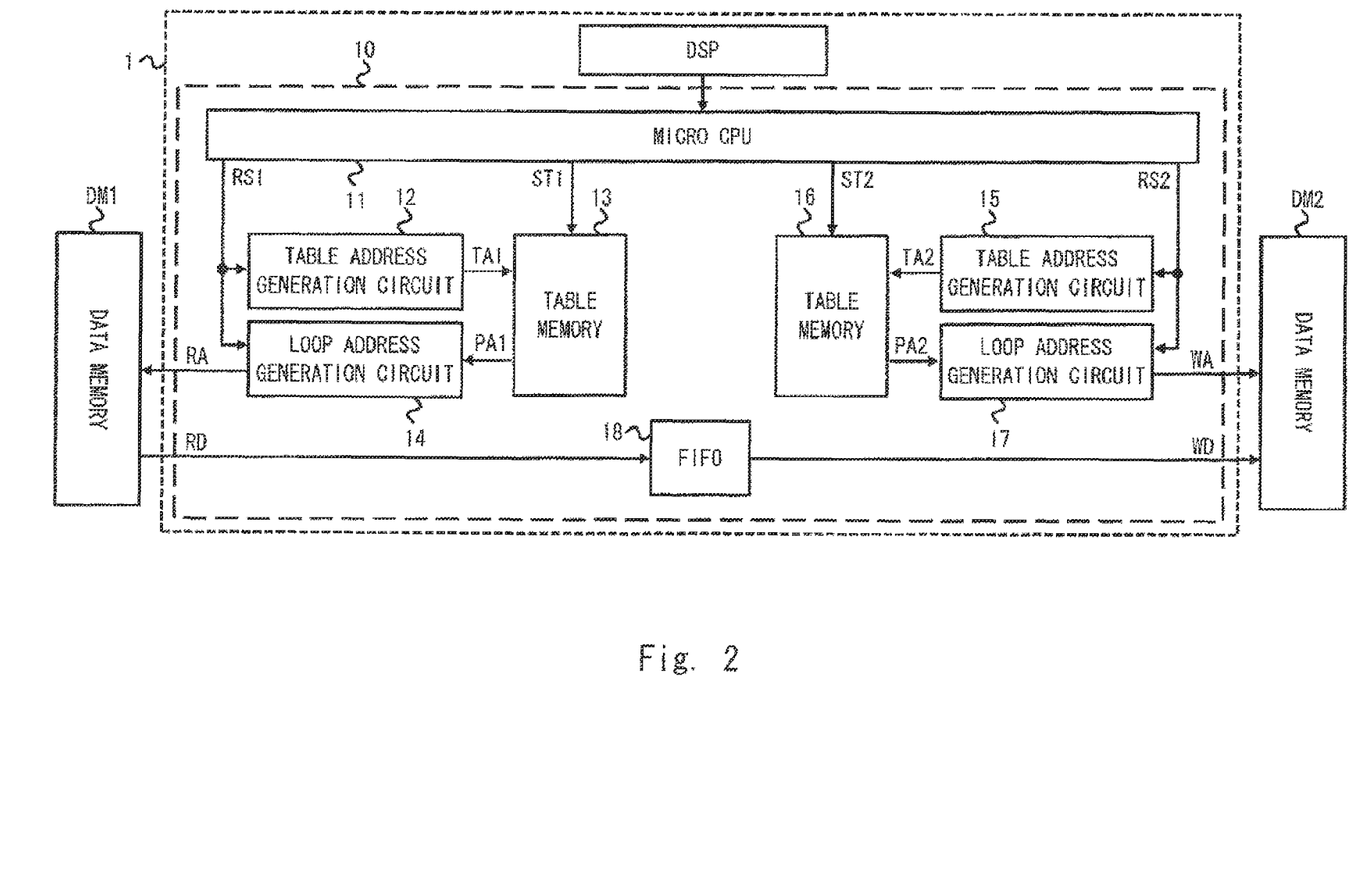
FIG. 2 is a block diagram of a semiconductor device according to a first embodiment.

The above communication system is supplied with the reception data as stream data. Therefore, it is necessary to continuously perform the deinterleave process. However, as the continuous deinterleave process uses a large part of the processing capability of the DSP, when the decoding process is performed by software using the DSP, there is a problem that other processes that must be performed by the DSP cannot be adequately performed. Therefore, the semiconductor device 1 according to the first embodiment includes a memory controller 10 for continuously performing the deinterleave process. Hence, the semiconductor device 1 according to the first embodiment reduces load associated with the deinterleave process by the DSP so as to realize the improvement in the performance. FIG. 2 is a block diagram of the semiconductor device 1 according to the first embodiment.

As shown in FIG. 2, the semiconductor device 1 according to the first embodiment includes a DSP, the memory controller 10, and data memories DM1 and DM2. Note that the DSP, the memory controller 10, and the data memories DM1 and DM2 may be respectively mounted as individual semiconductor devices. Alternatively, the DSP and the memory controller 10 may be configured as one semiconductor device, and the data memories DM1 and DM2 may be respectively configured as individual semiconductor devices. That is, the configuration of the DSP, the memory controller 10, and the data memories DM1 and DM2 may be changed as appropriate depending on the usage of the system.

Moreover, in the semiconductor device 1 according to the first embodiment, data that will be subjected to the deinterleave process shall be supplied to the data memory DM1 from a processing unit that performs the process before the deinterleave process. Further, the data that has been subjected to the deinterleave process is stored to the data memory DM2. For example, when the semiconductor device 1 performs the frequency deinterleave process, the process result of the carrier demodulation process 113 is stored to the data memory DM1. In addition, the process result of the frequency interleave process is stored to the data memory DM2.

The DSP is an operational unit that performs operations in accordance with a program. For example, when the semiconductor device 1 according to the first embodiment performs the decoding process shown in FIG. 1, the DSP performs the processes on and after the quadrature demodulation process 107 excluding the deinterleave process. At the time of startup or before executing the deinterleave process, the DSP issues a decoding method specifying instruction that instructs the memory controller 10 a decoding method. In response to the decoding method specifying instruction, the memory controller 10 reads operating condition specifying information necessary for its own operation from a memory not shown, and performs setting for its own operation. Note that the operating condition specifying information may be supplied to the memory controller 10 by the DSP. In the semiconductor device 1 according to the first embodiment, one memory controller 10 performs three deinterleave processes shown in FIG. 1, thus before the deinterleave processes, the memory controller 10 reads the operating condition specifying information corresponding to the respective deinterleave processes to be executed thereafter.

The memory controller 10 starts operation in response to the instruction from the DSP, and inputs and outputs data to and from the data memory using an access address generated by the memory controller 10 itself. The memory controller 10 shown in FIG. 2 generates a read address RA and a write address WA as the access addresses. Note that in the example shown in FIG. 2, the memory controller 10 generates the read address RA and the write address WA, which are different from each other, using the same circuit block, however the memory controller 10 may generate either one of the read address RA and the write address WA.

As shown in FIG. 2, the memory controller 10 includes a micro CPU 11, table address generation circuits 12 and 15, table memories 13 and 16, loop address generation circuits 14 and 17, and a FIFO (First In First Out) memory 18.

The micro CPU 11 is a control unit that controls the operation of the memory controller 10. The micro CPU 11 generates setting information for the memory controller 10 to perform a generation process of the access address based on the operating condition specifying information that is supplied externally. This setting information may be the same as the operating condition specifying information or may be generated by the micro CPU 11 performing an operation to the operating condition specifying information. In the example shown in FIG. 2, the micro CPU 11 generates register setting values RS1 and RS2 and table information ST1 and ST2 as the setting information.

The register setting value RS1 includes values stored to registers in the table address generation circuit 12 and the loop address generation circuit 14. The register setting value RS2 includes values stored to registers in the table address generation circuit 15 and the loop address generation circuit 17. The semiconductor device 1 according to the first embodiment generates read address RA and the write address WA indicating different addresses from each other, thus the register setting value RS1 and the register setting value RS2 have different values.

The table information TS1 is stored to the table memory 13. Further, the table information TS2 is stored to the table memory 16. The table information TS1 and TS2 associates a table address with parameter information.

In the memory controller 10, the table address generation circuit 12, the table memory 13, and the loop address generation circuit 14 compose a read address generation unit. Moreover, the table address generation circuit 15, the table memory 16, and the loop address generation circuit 17 compose a write address generation unit. In the memory controller 10, the read address generation unit and the write address generation unit generate the access addresses with different values by receiving the setting information with different values from each other. However, the circuit block composing the read address generation unit and the circuit block composing the write address generation unit both have the same functions.

The table address generation circuit 12 and the table address generation circuit 15 function as a first address generation unit. The table address generation circuit 12 and the table address generation circuit 15 includes a first register group and generates the table address by a first pattern that cyclically repeats using values stored to the first register group. Note that the table address output from the table address generation circuit 12 is denoted by a code TA1 and the table address output from the table address generation circuit 15 is denoted by a code TA2. Moreover, the values stored to the first register group are determined by the register setting values RS1 and RS2.

The table memory 13 includes the table information associating the parameter information with a table address TA1 and outputs parameter information PA1 corresponding to an address value of the table address TA1. The table memory 16 includes the table information associating the parameter information with a table address TA2 and outputs parameter information PA2 corresponding to an address value of the table address TA2.

The loop address generation circuit 14 and the loop address generation circuit 17 function as a second address generation unit. The loop address generation circuit 14 and the loop address generation circuit 17 include a second register group and generate the access address by a second pattern that cyclically repeats using values stored to the second register group and the parameter information output from the table memory. Note that the access address output from the loop address generation circuit 14 is the read address RA, and the access address output from the loop address generation circuit 17 is the write address WA. Moreover, the values stored to the second register group are determined by the register setting values RS1 and RS2.

The FIFO memory 18 stores read data RD read from the data memory by the read address RA in the order of being read and outputs the data in the order of storage. The data output from the FIFO memory 18 will be write data WD to the data memory DM2.

In the memory controller 10, the table address generation circuit 12 generates the table address TA1 by the first pattern that cyclically repeats based on the setting information determined by the register setting value RS1. This table address TA1 differs in each address generation cycle. Therefore, the parameter information PA1 referred to from the table information according to this table address TA1 changes in each address generation cycle. Then, the loop address generation circuit 14 generates the read address RA by the second pattern that cyclically repeats based on the setting information determined by the parameter information PA1 and the register setting value RS1. The read address RA is generated in this way using the table address generation circuit 12, the table memory 13, and the loop address generation circuit 14, and this enables generation of the periodic and non-continuous read address RA without using the processing capability of the DSP.

Moreover, in the memory controller 10, the write address WA is generated in a similar process to the read address RA, thereby also enabling generation of the periodic and non-continuous write address WA without using the processing capability of the DSP.

From the above explanation, the semiconductor device 1 according to this embodiment can generate, by means of the memory controller 10, the periodic and non-continuous access address without using the processing capability of the DSP. At this time, the semiconductor device 1 generates the table address by the first pattern that cyclically repeats using the setting information and selects the parameter information from the table information based on the table address for each address generation cycle. Additionally, the semiconductor device 1 generates the access address by the second pattern that cyclically repeats based on the pattern information and the setting information. Specifically, the semiconductor device 1 can generate the non-continuous access address that changes over a long cycle as compared to the size of the table information without including all the non-continuous address values as the table information. Consequently, the semiconductor device 1 according to the first embodiment can reduce the size of the table memory 13.

Moreover, with the technique disclosed in Japanese Unexamined Patent Application Publication Nos. 59-114655 and 03-260750, a change is required in the hardware in order to support a decoding method other than the decoding method has been initially assumed, thereby causing a problem that requires redesign.

However, in the semiconductor device 1 according to the first embodiment, the generation pattern of the access address can be changed by changing at least one of the register setting values RS1 and RS2, and the table information ST1 and ST2. As described so far, the semiconductor device 1 can change the generation pattern of the access address by the micro CPU 11 changing setting information corresponding to a data format of the data based on an instruction from the DSP that performs data processing. In other words, the semiconductor device 1 can programmably change the generation pattern of the access address. As has been explained, with the generation pattern of the access address that can be programmably changed, it is possible to flexibly respond to a change in the decoding method in the case of supporting a decoding method different from the decoding format initially assumed by the receiver.

Second Embodiment

In a second embodiment, a configuration example of the table address generation circuits 12 and 15, and the loop address generation circuits 14 and 17 is explained. Note that the configuration example explained in the second embodiment is an example showing a generation pattern of the access address, and there can be various configurations of the table address generation circuits 12 and 15, and loop address generation circuits 14 and 17. Note that the explanation is omitted for the same components in the semiconductor device 2 according to the second embodiment as those in the semiconductor device 1 according to the first embodiment.

Figure 3:
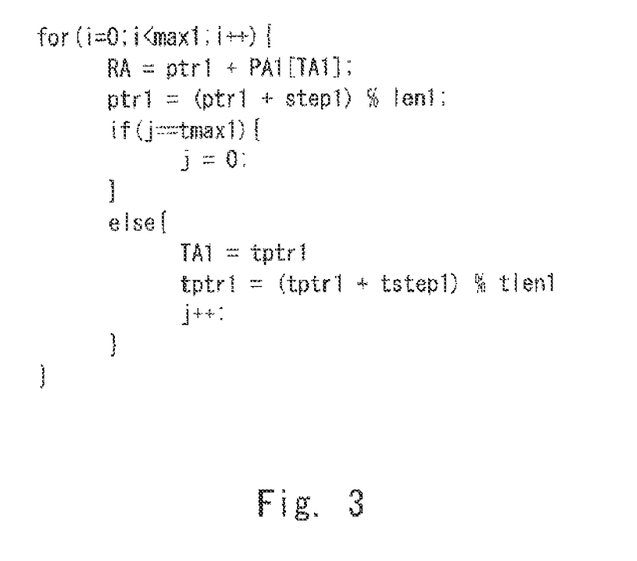
FIG. 3 shows an example of a program representing a generation pattern of an access address generated by a semiconductor device according to a second embodiment.

First, FIG. 3 shows a generation algorithm for the access address in the semiconductor device 2 according to the second embodiment. The algorithm shown in FIG. 3 is a representation of the generation algorithm for the read address RA in C language.

As shown in FIG. 3, in the generation algorithm for the read address RA in the semiconductor device 2 according to the second embodiment, a value PA1 [TA1] supplied as the parameter information is added to a temporary address value ptr1 so as to generate the read address RA. This temporary address value ptr1 is calculated by performing remainder calculation using a repeating period value len1 on the sum of the temporary address value ptr1 calculated in the previous address generation cycle and a step width step1.

The table address TA1 is calculated by performing remainder calculation using a repeating period value tlen1 on the sum of the address value tptr1 calculated in the previous address generation cycle and a step width tstep1.

In the algorithm shown in FIG. 3, the read address RA is generated in accordance with the above algorithm for each processing cycle until the number of address processing cycles reaches a maximum number of loops maxi. Further, whenever the number of address generation cycles reaches a maximum number of loops tmax1 in a period until the number of address generation cycle reaches the maximum number of loops maxi, the table address TA1 is reset to the initial value and the generation process of the table address TA1 is repeated.

Figure 4:
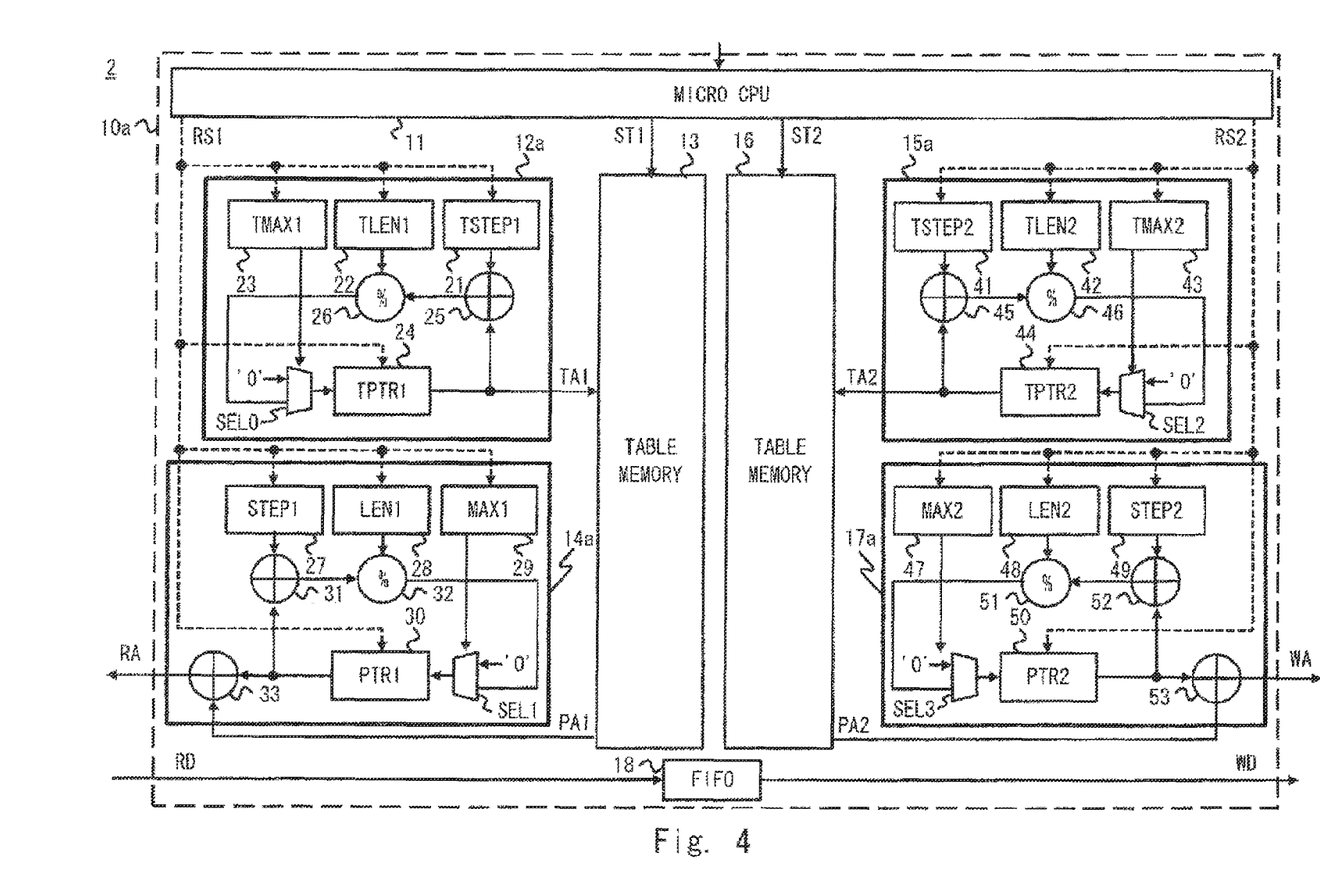
FIG. 4 is a block diagram of the semiconductor device according to the second embodiment.

Given below is an explanation of the table address generation circuit and the loop address generation circuit having the configuration for realizing the address generation algorithm shown in FIG. 3. FIG. 4 is a block diagram of the semiconductor device 2 according to the second embodiment that includes table address generation circuits 12a and 15a, and loop address generation circuits 14a and 17a, which are configuration examples of the table address generation circuits 12 and 15 and the loop address generation circuits 14 and 17. Note that the example shown in FIG. 4 illustrates only a memory controller 10a including the table address generation circuits 12a and 15a, and the loop address generation circuits 14a and 17a. That is, the semiconductor device 2 according to the second embodiment also has the DSP in a similar manner as the first embodiment. Moreover, the memory controller 10a accesses the data memories DM1 and DM2.

The table address generation circuit 12a includes first registers 21 to 24, an adder 25, a remainder calculator 26, and a selector SEL0. An updating step width TSTEP1 is stored to the first register 21. A repeating period value TLEN1 is stored to the first register 22. A maximum number of loops TMAX1 is stored to the first register 23. An address value TPTR1 is stored to the first register 24. This address value TPTR1 will be the table address TA1. The adder 25 adds the calculated address value TPTR1 and the updating step width TSTEP1 and outputs the result thereof. The remainder calculator 26 performs remainder calculation on the result value output from the adder 25 using the repeating period value TLEN1 and outputs the calculation result. Then, the address value TPTR1 stored to the first register 24 is updated by the calculation result output from the remainder calculator 26. Further, in the table address generation circuit 12a, a selector SEL0 is provided between the remainder calculator 26 and the first register 24. The selector SEL0 outputs the value output from the remainder calculator 26 in the period until the number of address generation cycles reaches the maximum number of loops TMAX1, and outputs 0 when the number of address generation cycles reaches the maximum number of loops TMAX1. When the selector SEL0 outputs 0, the address value TPTR1 is reset to the initial value (for example, 0) in the table address generation circuit 12a. Accordingly, the table address generation circuit 12a resumes the generation operation of the table address TA1 from the initial state.

The loop address generation circuit 14a includes second registers 27 to 30, adders 31 and 33, a remainder calculator 32, and a selector SEL1. An updating step width STEP1 is stored to the second register 27. A repeating period value LEN1 is stored to the second register 28. A maximum number of loops MAX1 is stored to the second register 29. A temporary address value PTR1 is stored to the second register 30. A value obtained by adding the parameter information PA1 to the temporary address value PTR1 will be the read address RA. The adder 31 adds the calculated temporary address value PTR1 and the updating step width TSTEP1 and outputs the result thereof. The remainder calculator 32 performs remainder calculation on the result value output from the adder 31 using the repeating period value LEN1 and outputs the calculation result. Then, the temporary address value PTR1 stored to the second register 30 is updated by the calculation result output from the remainder calculator 32. The adder 33 adds the temporary address value PTR1 and the value provided by the parameter PA1 and outputs the read address RA. Further, in the loop address generation circuit 14a, the selector SEL1 is provided between the remainder calculator 32 and the second register 30. The selector SEL1 outputs the value output from the remainder calculator 32 in the period until the number of address generation cycles reaches the maximum number of loops MAX1, and outputs 0 when the number of address generation cycles reaches the maximum number of loops MAX1. When the selector SEL1 outputs 0, the temporary address value PTR1 is reset to the initial value (for example, 0) in the table address generation circuit 12a. Accordingly, the loop generation circuit 14a resumes the generation operation of the read address RA from the initial state.

Although the table address generation circuit 15a has the same circuit configuration as the table address generation circuit 12a, the values stored to the registers are different. The table address generation circuit 15a includes first registers 41 to 44, an adder 45, and a remainder calculator 46. The first registers 41 to 44, the adder 45, the remainder calculator 46, and a selector SEL2 correspond to the first registers 21 to 24, the adder 25, the remainder calculator 26, and the selector SEL0, respectively. In the table address generation circuit 15a, an updating step width TSTEP2 is stored to the first register 41, a repeating period value TLEN2 is stored to the first register 42, and a maximum number of loops TMAX2 is stored to the first register 43. Moreover, an address value TPTR2 is stored to the first register 44. This address value TPTR2 will be the table address TA2.

Although the loop address generation circuit 17a has the same circuit configuration as the loop address generation circuit 14a, the values stored to the registers are different. In the loop address generation circuit 17a includes second registers 47 to 50, adders 51 and 53, a remainder calculator 52, and a selector SEL3. The second registers 47 to 50, the adders 51 and 53, the remainder calculator 52, and the selector SEL3 correspond to the second registers 27 to 30, the adders 31 and 33, the remainder calculator 32, and the selector SEL1, respectively. Further, in the loop address generation circuit 17a, an updating step width STEP2 is stored to the second register 47, a repeating period value LEN2 is stored to the second register 48, and a maximum number of loops MAX2 is stored to the second register 49. A temporary address value PTR2 is stored to the second register 50. A value obtained by adding the parameter information PA2 to the temporary address value PTR2 will be the write address WA.

The second embodiment explained the configuration example of the table address generation circuit and the loop address generation circuit. As obvious from this explanation, the table address generation circuit and the loop address generation circuit can be realized by a simple configuration including registers and a small number of operational units. That is, in the semiconductor device 2 according to the second embodiment, such a simple circuit performs loop control to enable generation of a complicated address pattern that periodically changes. Further, the table address generation circuit and the loop address generation circuit are composed of simple circuits, thereby enabling the memory controller 10a to prevent from increasing the circuit area.

Third Embodiment

Figure 5:
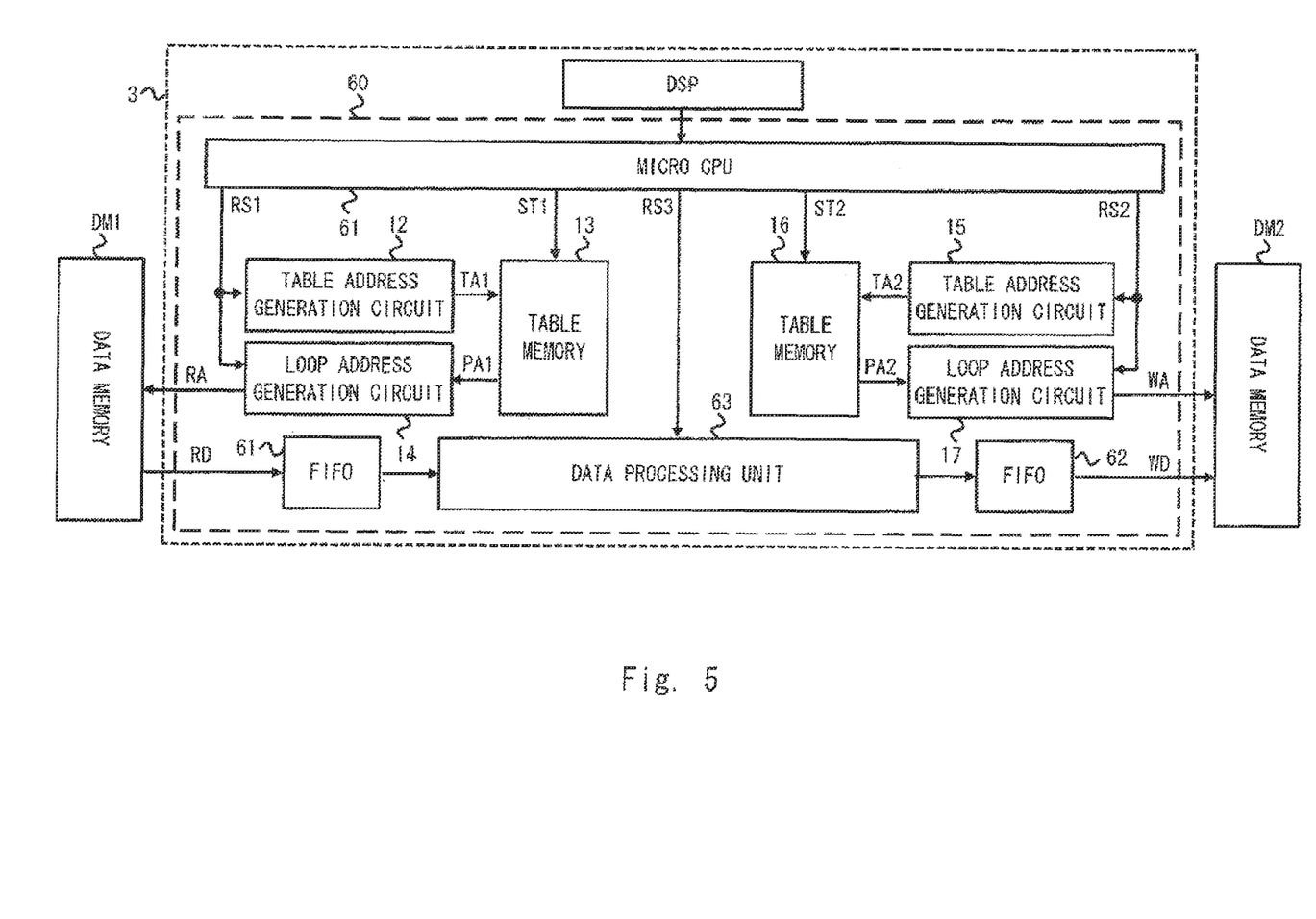
FIG. 5 is a block diagram of a semiconductor device according to a third embodiment.

FIG. 5 is a block diagram showing a semiconductor device 3 according to a third embodiment. As shown in FIG. 5, the semiconductor device 3 according to the third embodiment includes a memory controller 60 indicating another mode of the memory controller 10. In the memory controller 60, the FIFO memory 18 in the memory controller 10 according to the first embodiment is replaced with a data processing unit 63, and the micro CPU 11 is replaced with a micro CPU 61. Additionally, the memory controller 60 further includes FIFO memories 61 and 62 corresponding to the data processing unit 63.

The FIFO memory 61 is a buffer that temporarily stores the read data RD. Moreover, the FIFO memory 62 is a buffer that temporarily stores the write data WD. The data processing unit 63 performs signal processing to data read from the FIFO memory 61 and outputs the data to the FIFO memory 62.

A register setting value RS3 is supplied to the data processing unit 63. The data processing unit 63 performs signal processing according to the register setting value RS3. For example, the data processing unit 63 can perform a Viterbi decoding process and soft decision process in the Viterbi decoding process. Moreover, a micro CPU 61 further includes a function to output the register setting value RS3 to the micro CPU 11.

As described above, in the semiconductor device 3 according to the third embodiment, the data processing unit 63 is provided on a path for transmitting the read data RD to the data memory DM2, thereby enabling some sort of signal processing to be performed on the data stored to the data memory DM2. As the data processing unit 63 performs the signal processing in this way, the processing load of the DSP can be reduced.

Fourth Embodiment

Figure 6:
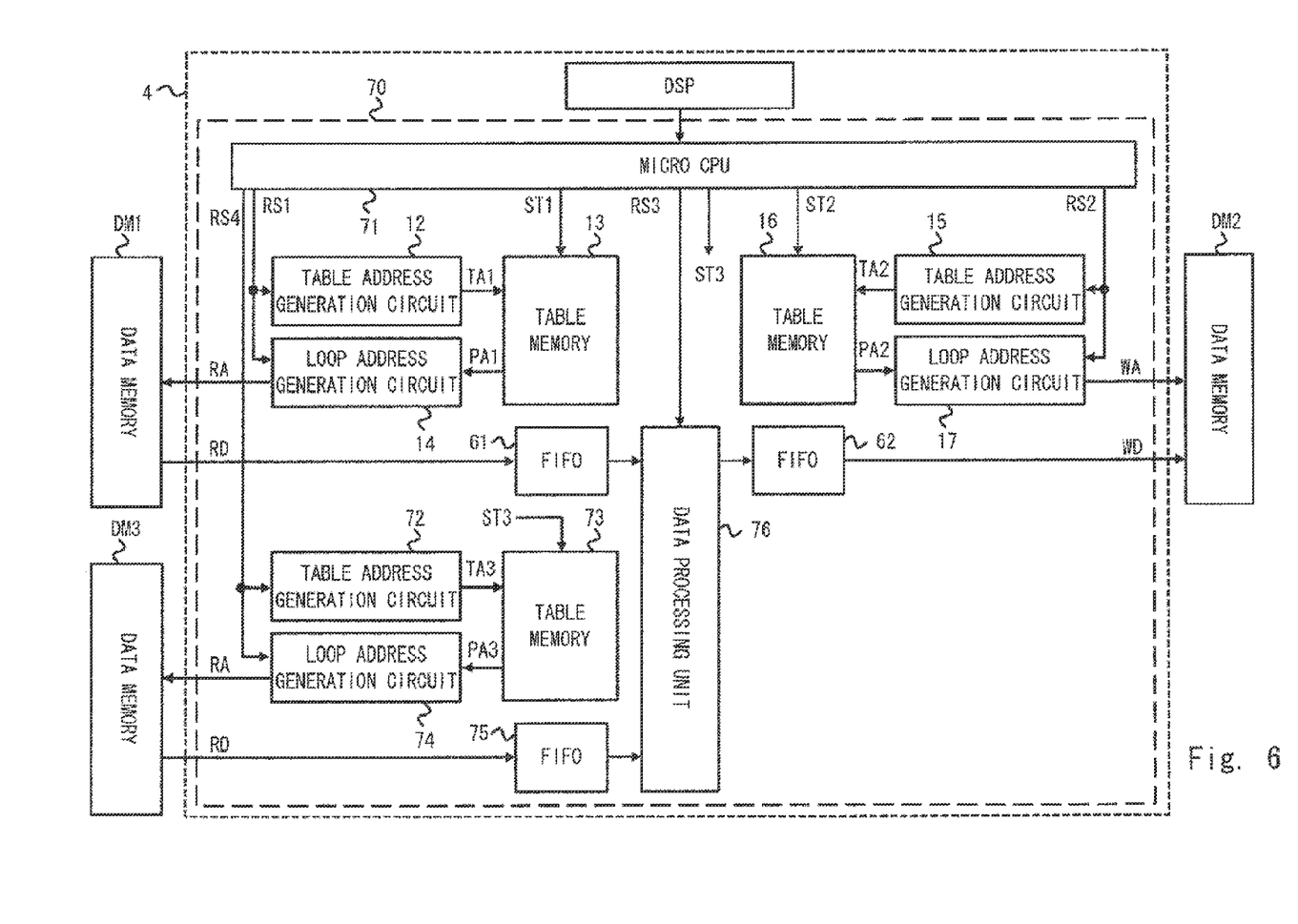
FIG. 6 is a block diagram of a semiconductor device according to a fourth embodiment.

FIG. 6 is a block diagram showing a semiconductor device 4 according to a fourth embodiment. As shown in FIG. 6, the semiconductor device 4 according to the fourth embodiment includes a memory controller 70 indicating another mode of the memory controller 60. In the memory controller 70, the data processing unit 63 in the memory controller 60 according to the third embodiment is replaced with a data processing unit 76, and the micro CPU 61 is replaced with a micro CPU 71.

The memory controller 70 further includes a table address generation circuit 72, a table memory 73, and a loop address generation circuit 74 for generating a second read address RA. The table address generation circuit 72 is a circuit block having the same function as the table address generation circuit 12, the table memory 73 is a circuit block having the same function as the table memory 13, and the loop address generation circuit 74 is a circuit block having the same function as the loop address generation circuit 14.

Moreover, the micro CPU 71 further includes a function to output a register setting value RS4 and table information ST3 to the micro CPU 61. The register setting value RS4 has a value independent from the register setting values RS1 and RS2. Additionally, the table information ST3 is independent from the table information ST1 and ST2. Further, the register setting value SR3 supplies setting values to the registers in the table address generation circuit 72 and the loop address generation circuit 74. The table information ST3 is stored to the table memory 73.

The memory controller 70 includes a FIFO memory 75. The memory controller 70 outputs the read address RA to each of the data memories DM1 and DM3, and reads the read data RD from each of the data memories DM1 and DM3. The FIFO memory 75 functions as a buffer that temporarily stores the read data output from the data memory DM3.

As has been mentioned, the memory controller 70 can generate two or more read addresses RA by providing multiple groups of the table address generation circuit, the table memory, the loop address, and the FIFO memory. Accordingly, the read data can be read simultaneously from two or more data memories by two or more read addresses RA.

The data processing unit 76 performs a multiplex process to the multiple pieces of read data RD read from two or more data memories, and generates one piece of write data WD. Such a multiplex process realizes a burst transmission that multiplexes multiple pieces of channel data. Moreover, although one piece of write data WD is generated in the example shown in FIG. 6, the data processing unit 76 may perform a demultiplex process to one piece of read data RD and generate multiple pieces of write data WD. When there are multiple pieces of write data WD, there must be provided multiple groups of the table address generation circuit, the table memory, the loop address, and the FIFO memory for generating the write address WA. Such a demultiplex process enables reading the data obtained by multiplexing multiple pieces of channel data as the read data RD in the burst transmission. Such a burst transmission improves the efficiency of data transfer.

Moreover, the data processing unit 76 can also perform the soft decision process in Viterbi decoding in addition to the multiplex process. The process performed by the data processing unit 76 can be switched by the register setting value RS3.

From the above explanation, the fourth embodiment explained the configuration example of a semiconductor device including one or more transfer channels for the read data RD and transfer channels for the write data WD. In a similar manner as the semiconductor device 1 according to the first embodiment, the semiconductor device 4 according to the fourth embodiment can generate an address value that intricately changes in a long cycle as compared to the size of the table information based on the calculation process and the table information. Therefore, even when different access addresses are used for multiple transfer channels as in the semiconductor device 4 according to the fourth embodiment, it is possible to suppress the increase in the circuit size. Similarly in the fourth embodiment, the generation algorithm for the access address can be changed by switching the setting information, thus it is possible to flexibly respond to a change in the decoding method supported by the system.

Note that in FIG. 6, the data memories DM1 to DM3 are illustrated as different circuit blocks. However, these memories may be mounted in regions of one circuit block logically divided.

Fifth Embodiment

Figure 7:
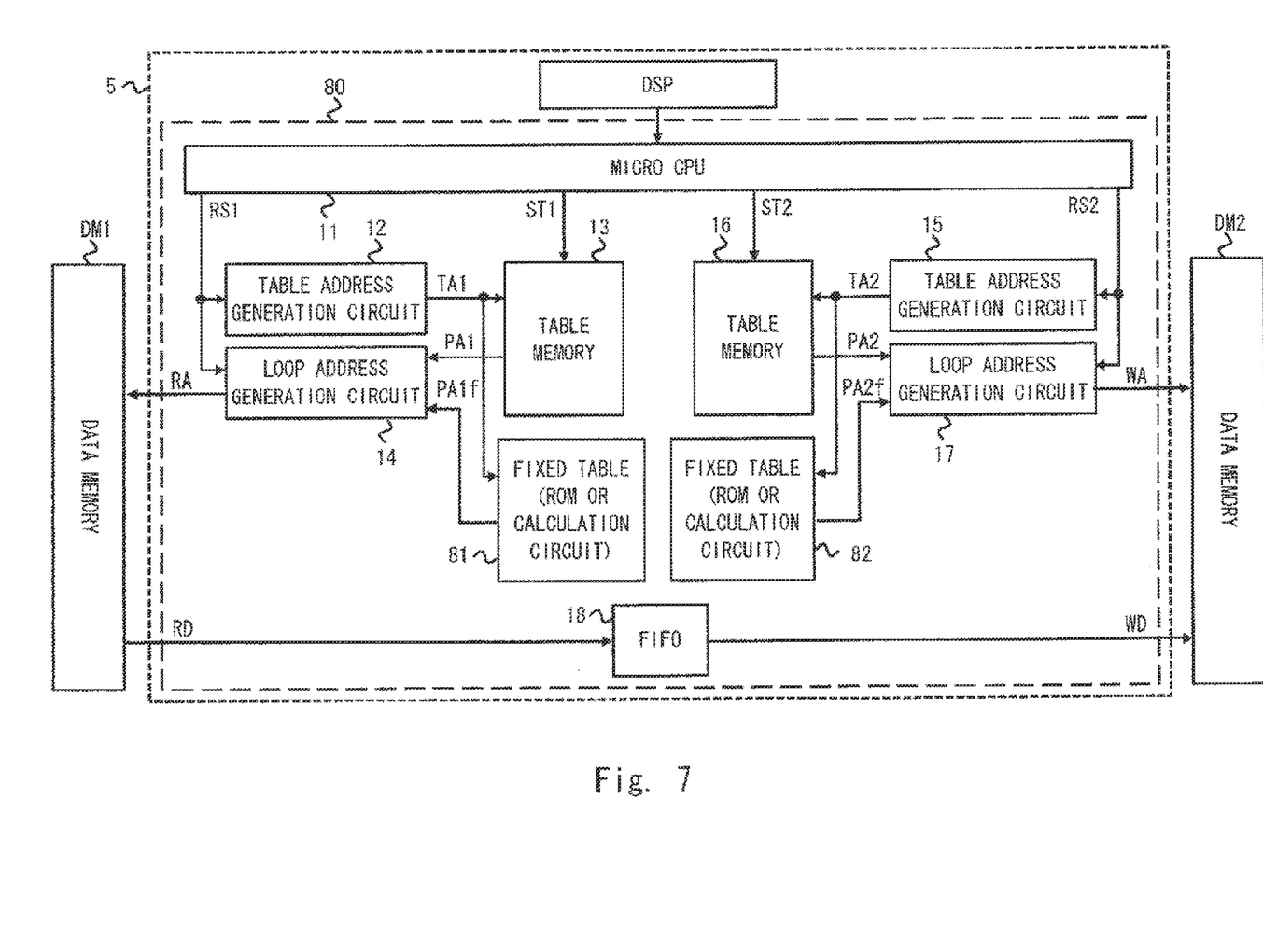
FIG. 7 is a block diagram of a semiconductor device according to a fifth embodiment.

FIG. 7 is a block diagram showing a semiconductor device 5 according to a fifth embodiment. As shown in FIG. 7, the semiconductor device 5 according to the fifth embodiment includes a memory controller 80 indicating another mode of the memory controller 10. The memory controller 80 further includes fixed tables 81 and 82 to the memory controller 10.

In the memory controller 80, the table memories 13 and 16 function as a first table memory, and the fixed tables 81 and 82 function as a second table memory. The table memories 13 and 16 store the first table information ST1 and ST2 that is supplied from the micro CPU 11 in a similar manner as the memory controller 10 according to the first embodiment. On the other hand, the fixed tables 81 and 82 store predetermined table information as second table information. These fixed tables 81 and 82 can be realized by a calculation circuit (a parameter information operational circuit, for example) that calculates the parameter information based on ROM (Read Only Memory) or the table addresses TA1 and TA2.

In the semiconductor device 5, the table address TA1 output from the table address generation circuit 12 is supplied to both the table memory 13 and the fixed table 81. When the table address TA1 indicates an address in the table memory 13, the parameter information PA1 is supplied to the loop address generation circuit 14 from the table memory 13. Moreover, when the table address TA1 indicates an address in the fixed table 81, parameter information PA1$f$ is supplied to the loop address generation circuit 14 from the fixed table 81. The loop address generation circuit 14 generates the read address RA using one of the parameter information PA1 and the parameter information PA1$f$.

In the semiconductor device 5, the table address TA2 output from the table address generation circuit 15 is supplied to both the table memory 16 and the fixed table 82. When the table address TA2 indicates an address in the table memory 16, the parameter information PA2 is supplied to the loop address generation circuit 17 from the table memory 16. Further, when the table address TA2 indicates an address in the fixed table 82, parameter information PA2$f$ is supplied to the loop address generation circuit 17 from the fixed table 82. The loop address generation circuit 17 generates the write address WA using one of the parameter information PA2 and the parameter information PA2$f$.

The operation pattern commonly used among different communication systems can be used in common. Therefore, the commonly used operation pattern is mounted as a ROM or a calculation circuit, and this thereby reduces the circuit size of the table memories 13 and 16. Moreover, a ROM is generally capable of simplifying a write circuit, a read circuit, and a storage element, thus ROM has a larger circuit size and higher power consumption and operation efficiency. For this reason, when the operation pattern that can be commonly used is mounted as a ROM, it is possible to improve the circuit size, the power consumption, and the operation efficiency of the semiconductor device. In addition, when the calculation circuit is used, it is not necessary to prepare individual table information that should be output, the circuit size can be reduced.

Sixth Embodiment

Figure 8:
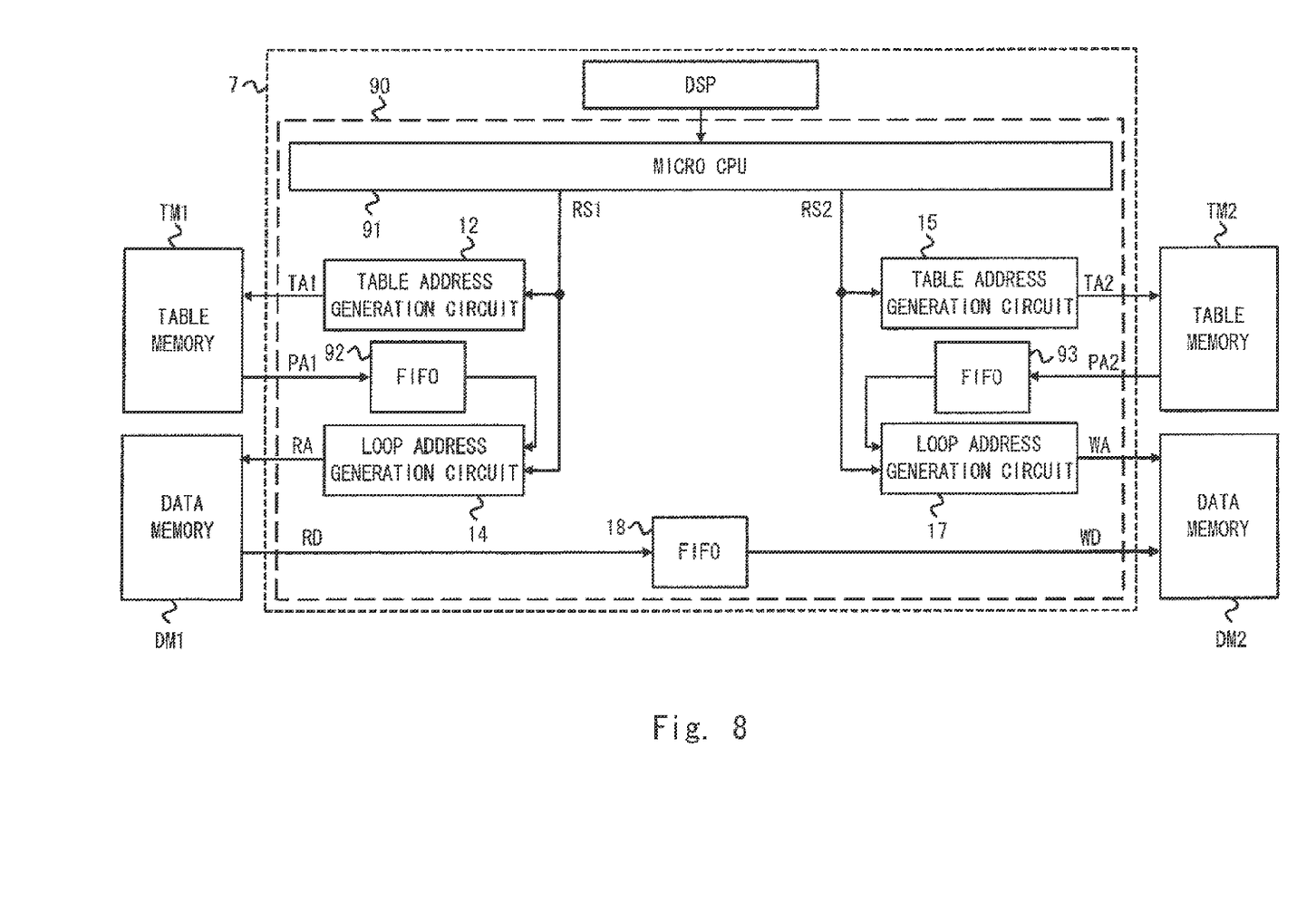
FIG. 8 is a block diagram of a semiconductor device according to a sixth embodiment.

FIG. 8 is a block diagram showing a semiconductor device 6 according to a sixth embodiment. As shown in FIG. 8, the semiconductor device 6 according to the sixth embodiment includes a memory controller 90 indicating another mode of the memory controller 10. Further, the semiconductor device 6 uses an external memory (SDRAM, for example) as the table memory in a similar manner as the data memory. FIG. 8 illustrates a table memory TM1 that is used to generate the read address RA and a table memory TM2 that is used to generate the write address WA.

The memory controller 90 eliminates the table memories 13 and 16 from the memory controller 10, and further includes FIFO memories 92 and 93. The memory controller 90 further includes a micro CPU 91 with an eliminated function of generating the table information TS1 and TS2 from the micro CPU 11. In the semiconductor device 6 according to the sixth embodiment, the table information ST1 and ST2 is stored to the table memories TM1 and TM2. In the semiconductor device 6, this table information ST1 and ST2 is supplied to the DSP through a bus not shown. Moreover, the micro CPU 91 may write the table information ST1 and ST2 to the table memories TM1 and TM2.

In the semiconductor device 6 according to the sixth embodiment, the parameter information PA1 is read from the table memory TM1 using the table address TA1 output from the table address generation circuit 12 as the read address. Then, the parameter information PA1 is temporarily held to the FIFO memory 92. The loop address generation circuit 14 generates the read address RA using the parameter information PA1 output from the FIFO memory 92.

Moreover, in the semiconductor device 6 according to the sixth embodiment, the parameter information PA2 is read from the table memory TM2 using the table address TA2 output from the table address generation circuit 15 as the read address. Next, the parameter information PA2 is temporarily held to the FIFO memory 93. Then, the loop address generation circuit 17 generates the write address WA using the parameter information PA2 output from the FIFO memory 93.

In this way, the table memories TM1 and TM2 can be realized by external memories. Using the external memories as the table memories TM1 and TM2 enables reduction in the circuit size of the semiconductor device 6. Further, the table memories TM1 and TM2 can also be defined as logically divided regions in a memory module that composes the data memories DM1 and DM2. As described above, by providing the table memories TM1 and TM2 in the logically divided region in the memory module, it is not necessary to add the memory module and thereby reducing the circuit size of the system. Additionally, the external memory generally has a larger capacity than the memory mounted on the semiconductor device 6. As the table memories TM1 and TM2 are mounted as the external memories, it is possible to flexibly respond to an increase in the table information.

Seventh Embodiment

Figure 9:
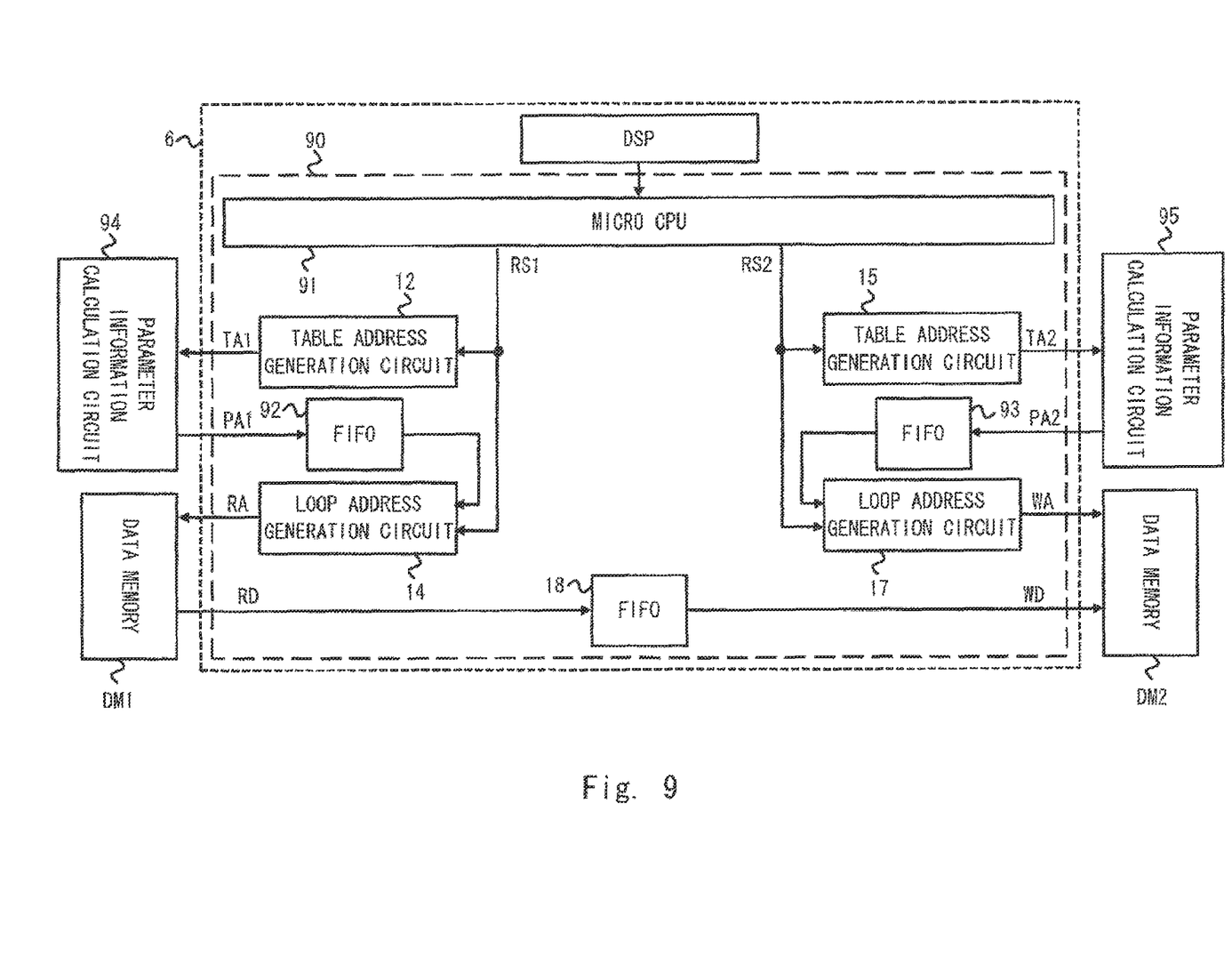
FIG. 9 is a block diagram of a semiconductor device according to a seventh embodiment.

FIG. 9 is a block diagram showing a semiconductor device 7 according to a seventh embodiment. As shown in FIG. 9, the semiconductor device 7 according to the seventh embodiment includes parameter information calculation circuits 94 and 95 in place of the table memories TM1 and TM2 in the semiconductor device 6 according to the sixth embodiment.

The parameter information calculation circuit 94 generates the parameter information PA1 by a calculation based on the table information TA1 generated in the table address generation circuit 12. The parameter information calculation circuit 95 generates the parameter information PA2 by a calculation based on the table information TA2 generated in the table address generation circuit 15.

With the parameter information calculation circuits 94 and 95 that are replaced from the table memories TM1 and TM2 in this way, the operation of the semiconductor device 7 according to the seventh embodiment will be the same as that of the semiconductor device 6 according to the sixth embodiment. Moreover, since the parameter information calculation circuits 94 and 95 do not need to include the parameter information as table data, the circuit size can be smaller than the case when the memories are used.

The first to seventh embodiments can be combined as desirable by one of ordinary skill in the art.

While the invention has been described in terms of several embodiments, those skilled in the art will recognize that the invention can be practiced with various modifications within the spirit and scope of the appended claims and the invention is not limited to the examples described above.

Further, the scope of the claims is not limited by the embodiments described above. For example, the algorithm for obtaining the same calculation result is not limited to one, and there can be multiple generation algorithms for obtaining the same calculation result.

Furthermore, it is noted that, Applicant's intent is to encompass equivalents of all claim elements, even if amended later during prosecution.

What is claimed is:

1. A semiconductor device comprising:
a first address generation unit that includes a first register group and generates a table address by a cyclically repeating first pattern using a value stored to the first register group;
a second address generation unit that includes a second register group and generates an access address by a cyclically repeating second pattern using a value stored to the second register group and parameter information determined by the table address; and
a control unit that outputs setting information to be supplied to the first register group and the second register group,
wherein the semiconductor device performs at least one of a read process and a write process of data from and to a data memory using the access address.

2. The semiconductor device according to claim 1, further comprising a table memory that includes table information associating the parameter information with the table address, wherein the control unit stores the table information to the table memory.

3. The semiconductor device according to claim 2, wherein the table memory includes a first table memory and a second table memory,
the first table memory stores first table information supplied from the control unit, and
the second table memory stores predetermined table information as second table information.

4. The semiconductor device according to claim 2, wherein the table memory is provided on a different semiconductor device from the semiconductor device.

5. The semiconductor device according to claim 1, further comprising a parameter information calculation circuit that calculates the parameter information based on the table address.

6. The semiconductor device according to claim 5, further comprising a first table memory that stores first table information supplied from the control unit, wherein the semiconductor device outputs the parameter information from one of the parameter information calculation circuit and the table memory based on the table address.

7. The semiconductor device according to claim 1, wherein the access address includes a read address used in the read process and a write address used in the write process,
the semiconductor device includes a read address generation unit that generates the read address and a write address generation unit that generates the write address, the read address generation unit and the write address generation nit each include the first address generation unit and the second address generation unit, and the control unit supplies the independent setting information to the read address generation unit and the write address generation unit.

8. The semiconductor device according to claim 1, further comprising a data processing unit that performs a predetermined operation to read data that is read in the read process, and generates write data that will be subject to the write process.

9. The semiconductor device according to claim 8, wherein the data processing unit reads the read data from one or more channels, performs a multiplex process or a demultiplex process to the read data, and generates one or more pieces of the write data.

10. The semiconductor device according to claim 1, wherein the control unit outputs the setting information supporting a data format of the data in response to an instruction from an operational unit that performs data processing to the data.

11. A semiconductor device comprising:
an operational unit that performs a calculation in accordance with a program; and
a memory controller that starts an operation in response to an instruction output from the operational unit, and inputs and outputs data from and to a data memory using an access address generated by the memory controller, wherein the memory controller comprises:
a control unit that determines an access rule to the data memory in response to the instruction and outputs setting information corresponding to the determined access rule;
a first address generation unit that generates a table address by a cyclically repeating first pattern using the setting information; and
a second address generation unit that generates the access address by a cyclically repeating second pattern using the setting information and parameter information determined by the table address.

12. The semiconductor device according to claim 11, further comprising a table memory that includes table information associating the parameter information with the table address, wherein the control unit stores the table information to the table memory.

13. The semiconductor device according to claim 12, wherein
the table memory includes a first table memory and a second table memory,
the first table memory stores first table information supplied from the control unit, and
the second table memory stores predetermined table information as second table information.

14. The semiconductor device according to claim 12, wherein the table memory is provided on a different semiconductor device from the semiconductor device.

15. The semiconductor device according to claim 11, further comprising a parameter information calculation circuit that calculates the parameter information based on the table address.

16. The semiconductor device according to claim 15, further comprising a first table memory that stores first table information supplied from the control unit, wherein the semiconductor device outputs the parameter information from one of the parameter information calculation circuit and the table memory based on the table address.

17. The semiconductor device according to claim 11, wherein
the access address includes a read address used in the read process and a write address used in the write process,
the memory controller includes a read address generation unit that generates the read address and a write address generation unit that generates the write address,
the read address generation unit and the write address generation nit each include the first address generation unit and the second address generation unit, and
the control unit supplies the independent setting information to the read address generation unit and the write address generation unit.

18. The semiconductor device according to claim 11, further comprising a data processing unit that performs a predetermined operation to read data that is read in the read process, and generates write data that will be subject to the write process.

19. The semiconductor device according to claim 18, wherein the data processing unit reads the read data from one or more channels, performs a multiplex process or a demultiplex process to the read data, and generates one or more pieces of the write data.

* * * * *